United States Patent
Lee et al.

(10) Patent No.: US 7,558,152 B2
(45) Date of Patent: Jul. 7, 2009

(54) ADDRESS COUNTER FOR NONVOLATILE MEMORY DEVICE

(76) Inventors: Hyungsang Lee, 117-1703 Parktown Samik Apt., Sunae-Dong, Bundang-Gu, Seongnam-Si, Gyeonggi-Do, 463-729 (KR); Dae Sik Song, Daewoo-Apt 103-1304, 296, Sangha-Dong, Giheung-Gu, Yongin-Si, Gyeonggi-Do, 446-773 (KR); Jacopo Mulatti, Via C. Percoto, 29, 33053 Latisana (IT)

( * ) Notice: Subject to any disclaimer, the term of this patent is extended or adjusted under 35 U.S.C. 154(b) by 12 days.

(21) Appl. No.: 11/829,527

(22) Filed: Jul. 27, 2007

(65) Prior Publication Data

US 2008/0028182 A1  Jan. 31, 2008

(30) Foreign Application Priority Data

Jul. 28, 2006  (EP) .................................. 06425535

(51) Int. Cl.
 *G11C 8/00* (2006.01)
(52) U.S. Cl. .............. 365/236; 365/185.12; 365/185.23
(58) Field of Classification Search ................. 365/236, 365/233, 185.11, 185.12, 185.23, 185.24
 See application file for complete search history.

(56) References Cited

U.S. PATENT DOCUMENTS

| 5,721,839 | A | * | 2/1998 | Callison et al. ............. 710/310 |
| 5,841,721 | A | * | 11/1998 | Kwon et al. ................. 365/218 |
| 6,771,559 | B2 | * | 8/2004 | Maruyama ................... 365/236 |
| 6,965,526 | B2 | * | 11/2005 | Cavaleri et al. ......... 365/185.29 |
| 7,164,613 | B2 | * | 1/2007 | Fekih-Romdhane et al. 365/201 |
| 2003/0031065 | A1 | | 2/2003 | Maruyama ................... 365/200 |
| 2006/0109735 | A1 | | 5/2006 | Fekih-Romdhane et al. 365/236 |
| 2008/0049542 | A1 | * | 2/2008 | Lee et al. ..................... 365/236 |

FOREIGN PATENT DOCUMENTS

EP    1126467    8/2001

\* cited by examiner

*Primary Examiner*—Gene N. Auduong
(74) *Attorney, Agent, or Firm*—Schwabe, Williamson & Wyatt, P.C.

(57) ABSTRACT

An address counter for a nonvolatile memory device includes a cascade of cells. Each cell includes an address counting flip-flop that is updated to a value of every newly counted address bit, or latches a column address bit value input by an external user of the memory device during ALE cycles for addressing a start memory location on a selected page. Each cell further includes an additional address loading flip-flop for loading the column address bit value input during ALE cycles for addressing the start memory location on the selected page during the ALE cycles. A logic circuit updates the address counting flip flop to the address bit value during a read confirm cycle in a read sequence, and during a first data input cycle in a program sequence.

24 Claims, 8 Drawing Sheets

ADDRESS COUNTER FOR NONVOLATILE MEMORY DEVICE

FIELD OF THE INVENTION

The present invention relates to nonvolatile memory devices, and more particularly, to an address counter for setting a memory location to a selected page in the nonvolatile memory device. An example nonvolatile memory is a NAND flash memory device.

BACKGROUND OF THE INVENTION

A page mode nonvolatile memory device includes a counter for controlling the addressing of memory locations in the selected page. The address counter starts from the value that is input thereto by the user during a specific command, and as illustrated in the data path flow scheme of FIG. 1, during read operations the value assumed by the address counter selects the memory location from which data is output. This is while during a program operation the value assumed by the address counter selects the memory location where data will be written.

The address counter plays an important role, and represents a critical component of the device. To better illustrate the technical problems to be addressed, a brief review of the manner in which the address counter functions during a read sequence and a program sequence follows.

Referring to the read sequence depicted in FIG. 2, the following are issued to the memory device in order to enter a read mode: a read command (00h), four address cycles (for the example taken into consideration) and a read confirm command (30h).

The internal address counter is initialized by the issuance of the four address cycles, and after this busy state the internal address counter is incremented at every toggling of the external read enable signal REN.

During each address latching cycle ALE, the internal address counter loads input data I/O into the correct position according to the number of the ALE cycle. When the read-confirm command (30h) is issued, the memory device enters a busy state. The memory cell array is accessed and information stored in the page selected by the row address is read and stored into a data register commonly referred to as page buffer.

After this busy state has ended, the external user will toggle the REN read enable command for outputting data read from the page buffer. Data is accessed on a byte or word base such that for any new RE toggling the column address counter will be incremented to select consecutive data stored in the selected page.

Referring to FIG. 3, the following are issued to the memory device in order to enter a program mode: the program command (80h) followed by four address input cycles (for the considered sample case) are issued to the memory device, serial data is loaded in the page buffer, and the program-confirm command (10h).

The internal address counter is initialized by the four address cycles, and subsequently, the counter is incremented at every toggling of the write enable signal WEN during the data cycles. During each ALE cycle, the internal address counter controls the loading of input address bits in the correct positions, according to the number of the ALE cycle.

When the last address cycle is issued, the row address (A27-A12) is frozen while the column address (A11-A0) is incremented at every toggling of the WEN signal during the data cycles in order to load input data in the page buffer in a consecutive mode. An elementary cell of an internal address counter as typically realized for implementing the above described algorithms for read and program operations is shown in FIG. 4.

The external command LOADADD is applied on a pad of the memory device. The ADD signal is cleared when RESET_ADD is high, or briefly H. At the rising edge of the signal address counter CK_ADD, which is internally generated by the input logic circuitry of the counting flip flop (F/F) of the elementary cell or module of the address counter, latches an ADD value which is either: 1) LOADADD, when ENLOAD is H, or 2) (CARRY xor ADD) when ENCOUNT is H and ENLOAD is L.

In all other cases, the ADD value maintains the logical value previously set in the flip flop F/F. ADD represents a Counted Address Value (all ADD values constitute a first internal address bus).

ADD_A is a second Internal address bus that is generated from the ADD values of the first internal address bus to implement a pipeline arrangement for internal simultaneous multiple data transfers.

ENLOAD is high when the memory device loads PAD data as address values during the ALE cycles. If ENLOAD is high, CK_ADD is logically equal to WEN (CLK_SEL=00) and the ADD value is latched according to its PAD value.

After the busy state triggered by a read command sequence has ended, the user reads data from the page buffer by toggling REN. In this case, CK_ADD is logically equal to REN (CLK_SEL01), and the internal column counter value (ADD) is incremented by every new pulse of the REN signal.

Erase Verify is performed to verify whether all cells of a selected block have been erased. To check this condition, an internal algorithm is executed, which downloads cell information in the page buffer and checks whether the data stored in the page buffer data are all 1 on a byte-by-byte bases. For this purpose, column addresses are scanned from beginning to end. During Erase Verify, CK_ADD is equal to Erase_verify_ck (CLK_SEL=10) that is generated during the execution of the erase verify algorithm, and the ADD value is incremented at every new Erase_verify_ck pulse.

During execution of data cycles, the address counter needs to be incremented by WEN. Therefore, CK_ADD is equal to WEN_1CK (CLK_SEL=11) and the internal address counter value ADD is incremented at every WEN toggling. WEN_1CK is a signal whose function is to skip address counter increments during the first data cycle. The reason why such a WEN_1CK signal is used during data cycle is that when loading program data into the page buffer, the first data is to be loaded at the address set during the ALE cycle. Therefore, it is necessary to skip incrementing the address counter during the first WEN pulse of data cycle. Of course, the address counter value ADD is incremented by WEN_1CK starting from the WEN pulse of the second data cycle.

To get a sufficient timing margin for loading data from I/O in the page buffer (or for transferring data from the page buffer to I/O pads), a parallel processing scheme of data transfer is adopted. This is generally referred to as pipelining. FIG. 5 illustrates an example of a pipeline for a read operation.

The example pipeline is for the case of transferring two data in parallel. Therefore, two internal address buses, and two internal data buses are implemented. As described in the previous section, the counted address that is the ADD values stored in the gain or counting flip-flops F/F, that compose the Address Counter in FIG. 4, is the address counter information that forms a first internal address bus (ADD). Another or second internal address bus (ADD-A) is generated by using an adder according to the circuit diagram of FIG. 4 relative to an elementary (or module) of the Address Counter.

In the shown pipeline, whenever the counted address ADD changes, the internal address buses BUS0,1[n:1] also changes. Because there is no bit[0] in the internal address bus BUS1, the latter is updated every other RE pulse. The internal address bus BUS represents the adder result (ADD-A) of the counted address (ADD). This fact implies the occurrence of glitches on the internal address buses BUS0,1 during the portion indicated by the symbol (*) in FIG. 5 (i.e., the falling edge of RE) because of different timing delays in adding the result of a counted address for each bit of the internal address bus bit.

The values of BUS0,1 during the (*) portion of RE in FIG. 5 is unstable because they are changing during such an interval of time. Therefore, they are considered as unknown. On the other hand, these are as other internal address buses are directly connected to the page buffer and to the redundancy block. Therefore, whenever the buses BUS0,1 have glitches, redundancy will be evaluated for changing address values. Moreover, the addressing of the page buffer will also suffer instabilities. The more the duration of these instabilities (i.e., the * portion of RE in FIG. 5) is reduced, the more stable the operation of the page buffer and of the redundancy block will be.

Typically, in the case of a NAND Flash of small page size organization, the specifications require the user to issue a pointer (50h) to access a spare area before performing a read operation or a program operation. Therefore, it is known whether the user is going to access spare area or not before the input of an address.

In case of a small page organization of the memory, the spare area of each page is generally 16 bytes or 8 words. Therefore, when the external user inputs an address through a certain number of ALE cycles to access the spare area, only addresses (or more precisely the address bits) [3:0] (also indicated thereinafter with the short-hand notation A[3:0]) of the column address are available. Other address bits A[7:4] are discarded regardless of the users full address that has been input.

From the point of view of the address counter design, it is necessary to fix the address bits A[7:4] either to a low or high state to ensure correct operation of the counter. In a memory with a small page organization, this is possible because of the above described pointer requisite. In contrast, in case of a large page organization of the memory device, there is no pointer command for accessing the spare area of the memory device, and to do so the user needs to input the address bit A11 set to a high logic value (X8 mode).

Commonly, in case of a large page organization, the spare area on each page is 64 bytes or 32 words. When the user, through the sequence of ALE cycles, inputs an address in the spare area, only the address bits [5:0] among the column address bits are available. The other address bits[10:6] are to be discarded regardless (X8 mode).

Referring to FIG. 7, there is no chance to set A[10:6] to a low logic value because the information A11 that indicates that the access is to the spare area comes after the address bits A[10:6] have been input. Therefore, the address bits A[10:6] will be different according to the user's input, and because of this the design of the internal counter is generally more complicated to handle this situation.

SUMMARY OF THE INVENTION

In view of the foregoing background, an object of the present invention is to reduce the glitch problem associated with address counters for nonvolatile memory devices.

This and other objects, advantages and features in accordance with the invention are provided based on a modified address counter architecture. In each elementary cell or module of the address counter, an additional address latching flip-flop is provided for loading each externally applied memory address bit at the rising edge of an external address loading clock signal. This may be performed during ALE cycles to be successively transferred from the address loading flip flops to the main address counting flip flops of the address counter cell or module.

In this way, the generation of glitches because of different timing delays in adding the counted address values may be prevented by separately controlling the loading of the external address, and the counting thereof by the address counting flip-flop of the cell.

Moreover, instead of employing an adder as in prior art architectures to generate at least a second internal address bus based on the address bus values output by the Internal Address Counter, for implementing a pipeline according to a preferred embodiment, an internal address bus (or buses) may be generated by adding respective internal address values bus driving flip flops in each bit cell (module) of the address counter, and controlled by the values stored in the leading and main flip flops through a control logic.

DETAILED DESCRIPTION OF THE PREFERRED EMBODIMENTS

Figure 1:
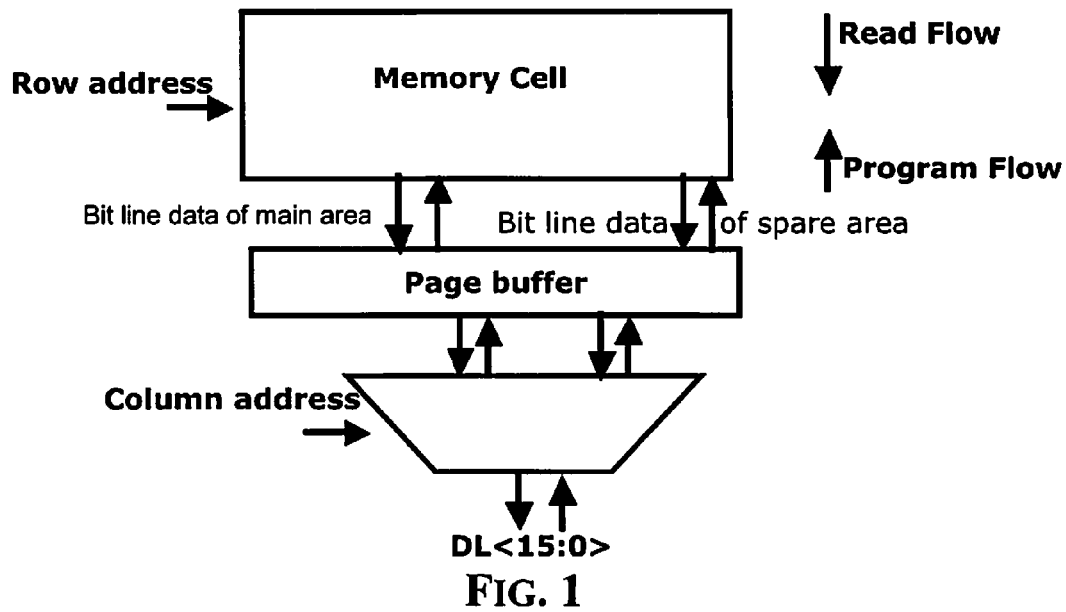
FIG. 1 is a data path flow scheme of a nonvolatile NAND type memory according to the prior art.
Figure 2:
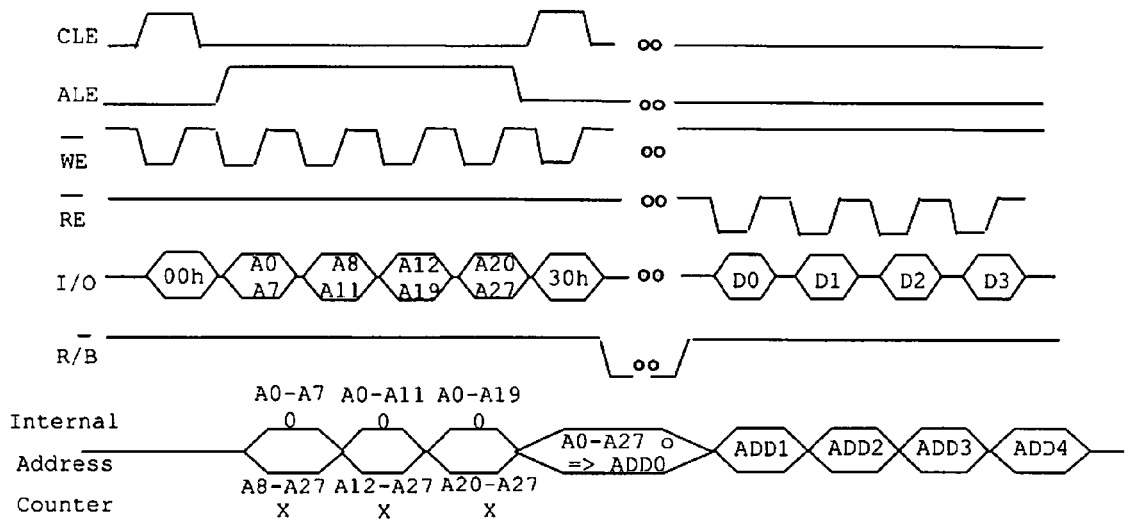
FIG. 2 illustrates a read sequence according to the prior art.
Figure 3:
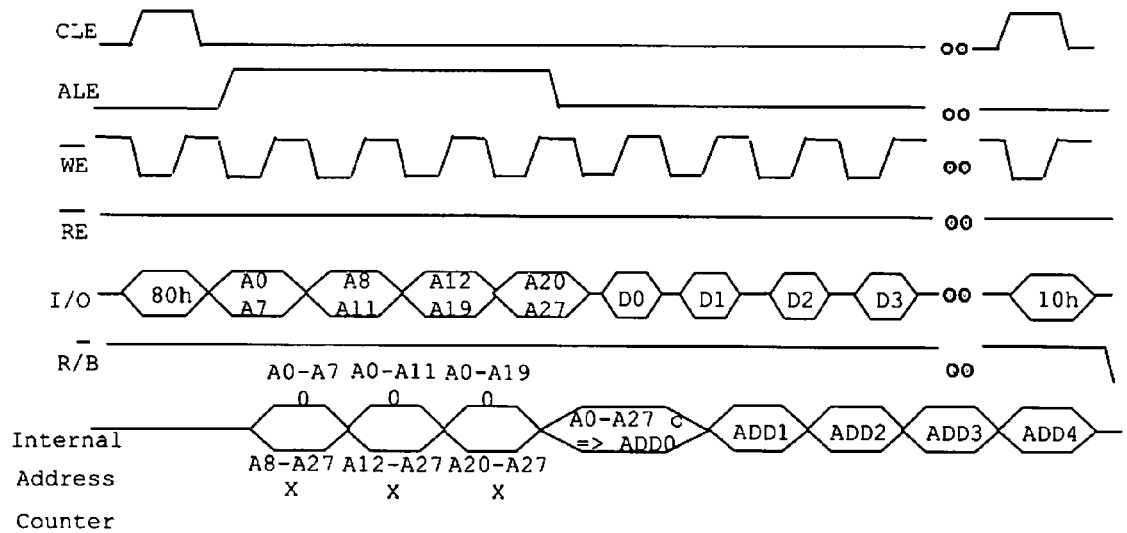
FIG. 3 illustrates a program sequence according to the prior art.
Figure 4:
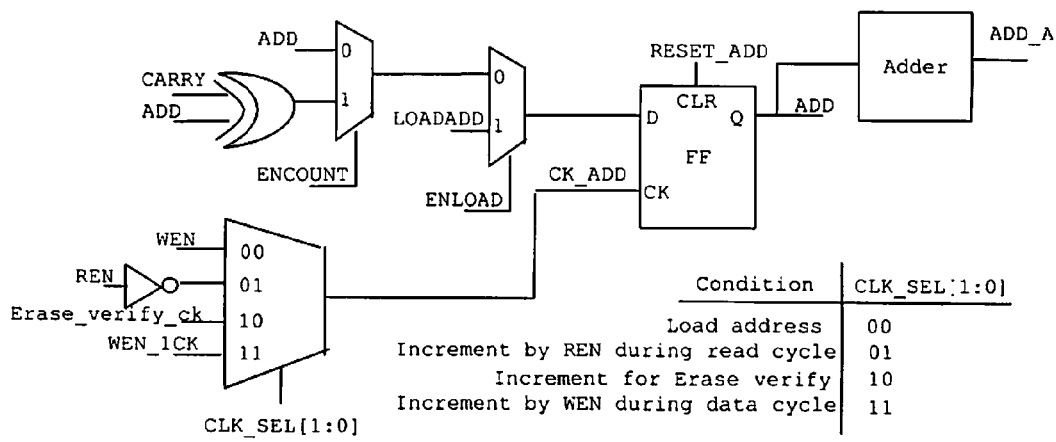
FIG. 4 shows a cell of a common internal counter architecture, and related clock conditions according to the prior art.
Figure 5:
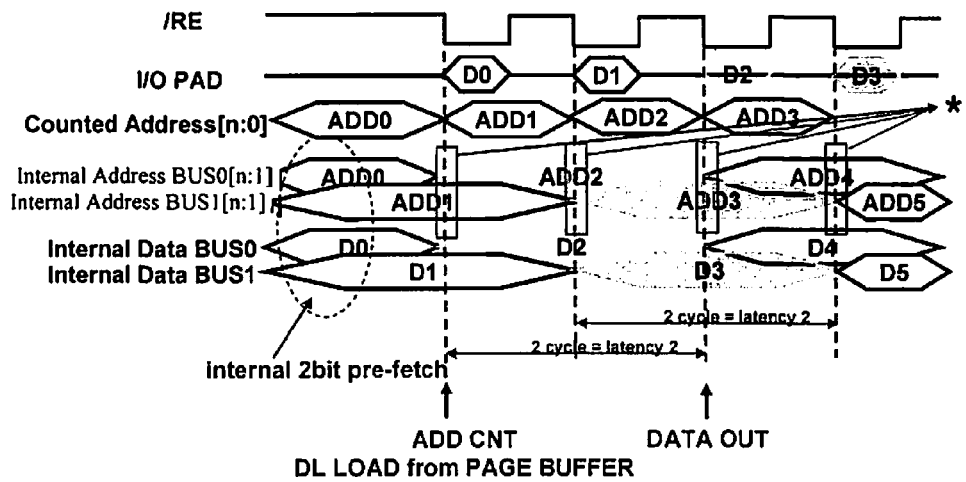
FIG. 5 illustrates an example of a pipeline implemented for a read operation according to the prior art.
Figure 6:
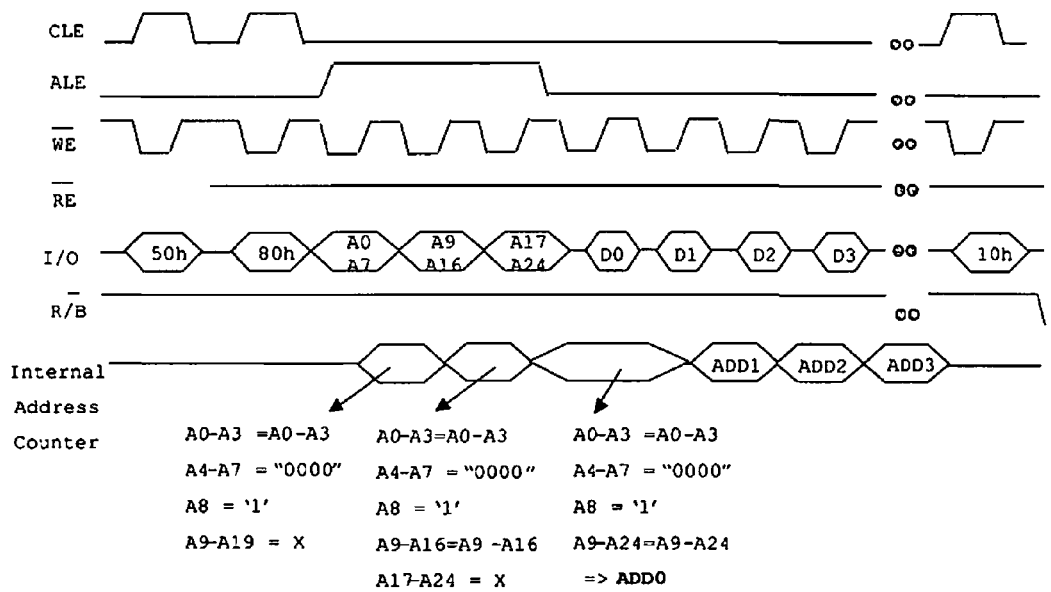
FIG. 6 illustrates the behavior of an internal address counter for accessing a spare area in a memory device having a small page organization (256MX8) according to the prior art.
Figure 7:
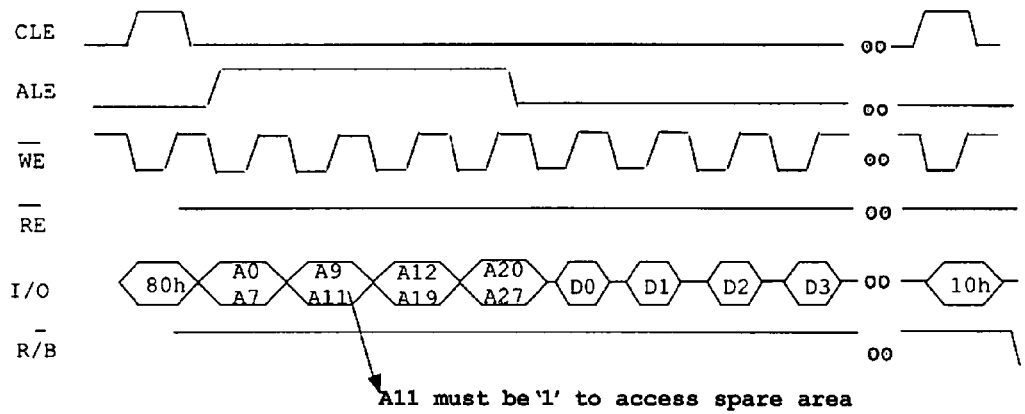
FIG. 7 illustrates the program sequence for accessing a spare area in a memory device having a large page organization (1GX8) according to the prior art.

In describing the features of the illustrated architecture of an internal (column) address counter compared to those in the known architecture of FIG. 5, the following TABLE 1 on the meanings of the numerous signal labels and circuit labels used in the drawings and in this description may be of assistance to the reader

TABLE 1

| | |
|---|---|
| CLE | Command Latch Enable. |
| ALE | Address Latch Enable. |
| R/B ! | Ready/Busy. |
| WEN | Negate of Write Enable |
| REN | Negate of Read Enable |
| $I/O_{0-7}$ | Data Inputs/Outputs |
| Erase_verify_ck | Clock that is generated when executing the erase verify algorithm |
| WEN AFTER ALE cycle | WEN signal after ALE cycle. That is, WEN cycle for pure data load. |
| CARRY[n] | the logic result of CARRY[n−1] and ADD(Q)[n−1] |
| LOADADD | Address data input from PAD during ALE cycle. It is the start address requested by the user. |
| ENCOUNT | 'H' when the Address Counting F/F(of the Main Counter) should be incremented at rising edge of every CK_ADD. |
| LOAD_UPDATE | 'H' when initially the value of the Address Loading F/F is loaded in the Address Counting F/F(of the Main Counter cell or module) to set the start address according to the user's input. |
| ENLOAD | 'H' during ALE cycles |
| AX_INC_2 | In order to make a pipeline for a read operation, a value LOADADD+2 must initially be loaded in the Internal Address F/F of the Internal Address BUS ADD_A0 of the novel Address Counter architecture. |
| READCTRL_CLE | 'H' when READ confirm (30h) is input. |
| AX_LOAD11 | For the Address Counting F/F[10:6], AX_LOAD11 is the Address[11] value among the start address bit values input by the user. For the Address Counting F/F[5:0], AX_LOAD11 is fixed to 'L'. |
| AX_INC_1 | In order to make a pipeline for a read operation, a value LOADADD+1 must be loaded in the Internal Address F/F off the Internal Address BUS ADD_A1 of the novel Address Counter architecture. |
| AX_LOAD0 | Address[0] value among the start address bit values input by the user. |
| CK_LOAD | Corresponds to the WEN signal when ALE is high |
| Address Loading F/F | Is the added F/F of each cell or module of the novel Address Counter for storing Address data input through the PAD when ALE is high and WEN is low. |
| Address Counting F/F | Is the main F/F of the basic Address Counter architecture. The value stored in the Address Loading F/F is loaded in the main Address Counting F/F to set the start address value according to the user's input with LOAD_UPDATE 'H'. Once the Address Counting F/F has loaded the value stored in the Address Loading F/F, the address may start to be incremented by CK_ADD. |
| ADD | output value of any of the Address Counting F/F that compose the Address Counter |
| ADD[0] | The counted address value of the Address Counting F/F[0] |
| Counted Address value | The values stored in the Address Counting F/F that compose the Address Counter. The number of Address Counting F/F depend on the capacity of device (for 1 Gbit (Large) page, the number is 27, for a 512 M (Large) Page, the number is 26) |
| Adder | In prior art architectures, it adds ADDs values to make a pipeline. In FIG. 5, Internal Address BUS0 is Counted Address value[n:1] + Counted Address value[0], whilst Internal Address BUS1 is Counted Address value[n:1]. |
| ADD_A | output of Adder. The number of ADD_A values depends on the capacity of device(1 Gbit Large page 26, 512 M Large Page 25). ADD_A corresponds to Internal Address BUS0 of FIG. 5. |
| Internal Address BUS0[n:1] | output of Adder. That is ADD_A values. The width of Internal Address BUS0 depends on the capacity of device(1 Gbit Large page 26, 512 M Large Page 25). |
| Internal Address BUS1[n:1] | The Counted Address values[n:1], That is the ADD values The width of Internal Address BUS1 depends on the capacity of device(1 Gbit Large page 26, 512 M Large Page 25). |
| ADD_A0 | Corresponds with the Internal Address BUS0[n:1] of FIG. 5. That is one internal address to make a read pipeline. |
| ADD_A1 | Corresponds with the Internal Address BUS1[n:1] of FIG. 5. That is the other internal address to make a pipeline. |

Figure 8A:
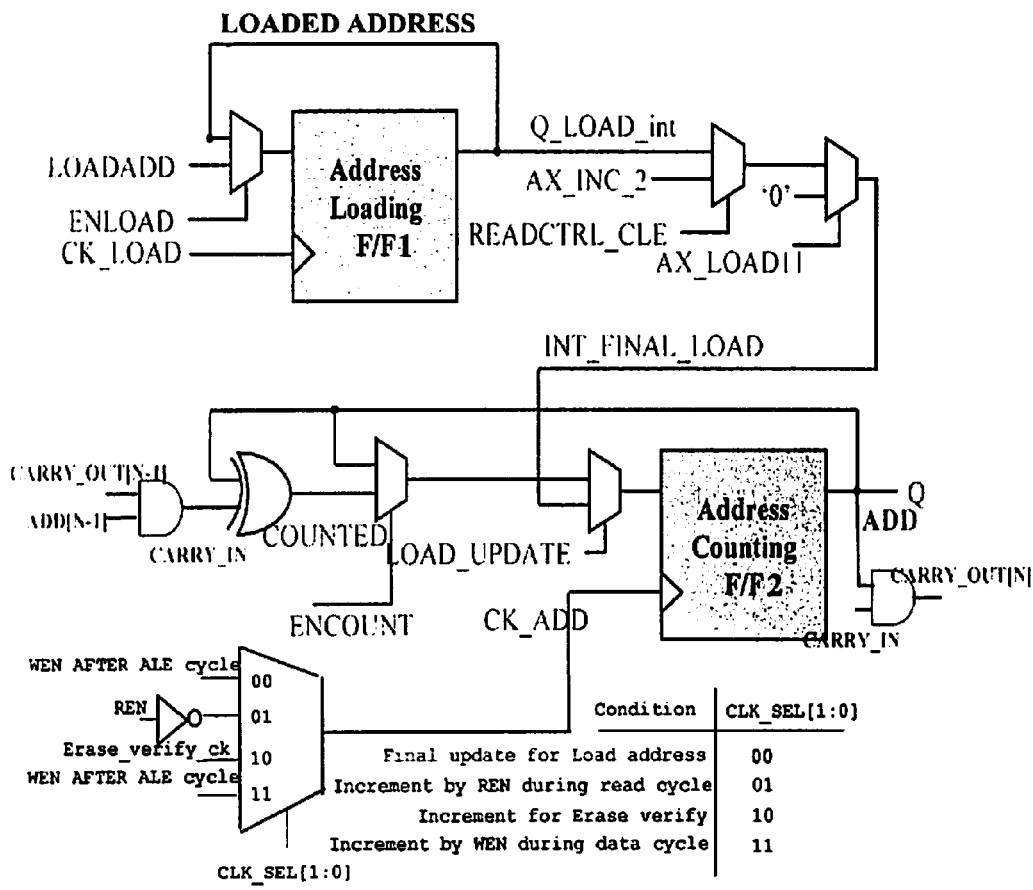
FIG. 8A is a basic circuit diagram of the address counter according to the present invention.

With reference to the diagram of FIG. 8A, address loading of externally input address values and their storing in the main address counting flip flop of the address counter is handled in two distinct flip-flops F/F1 and F/F2, respectively, for each cell of the address counter.

Figure 8B:
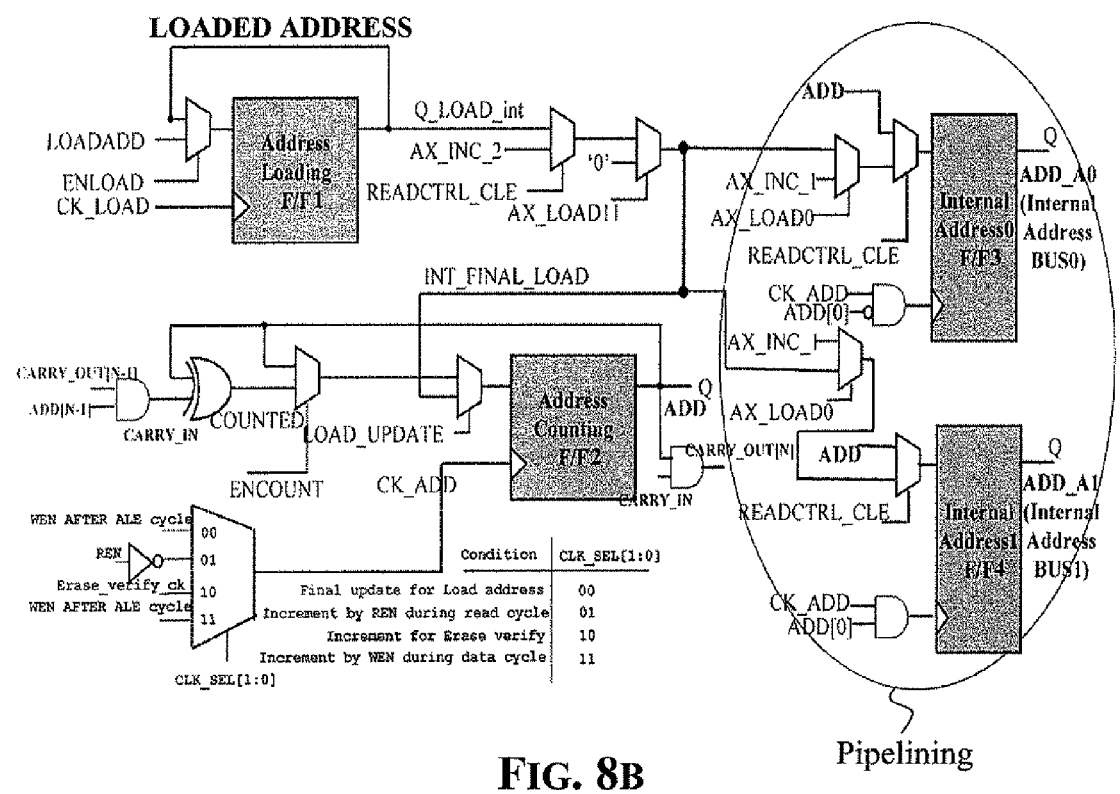
FIG. 8B shows a pipeline implementation in a cell of the address counter of FIG. 8A.
Figure 9:
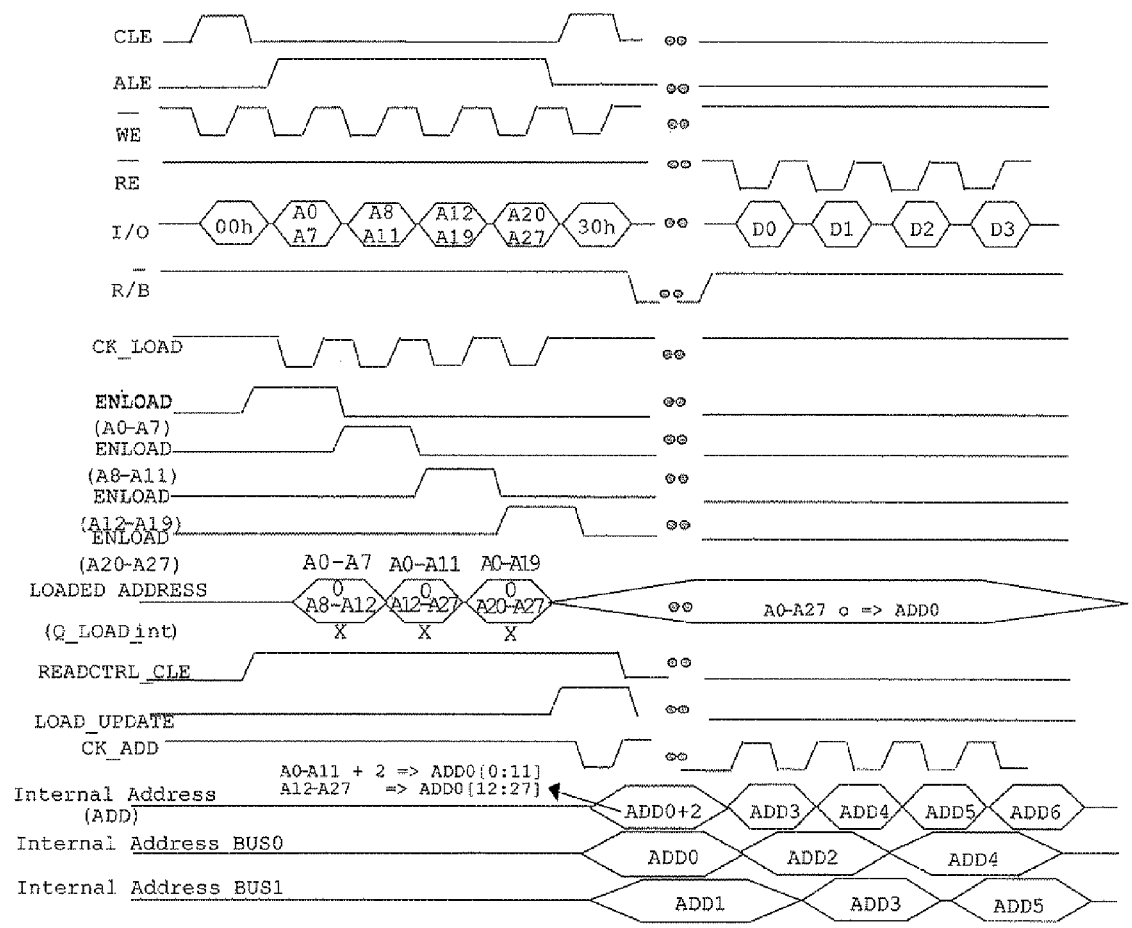
FIG. 9 illustrates the behavior of the address counter for a read operation according to the present invention.
Figure 10:
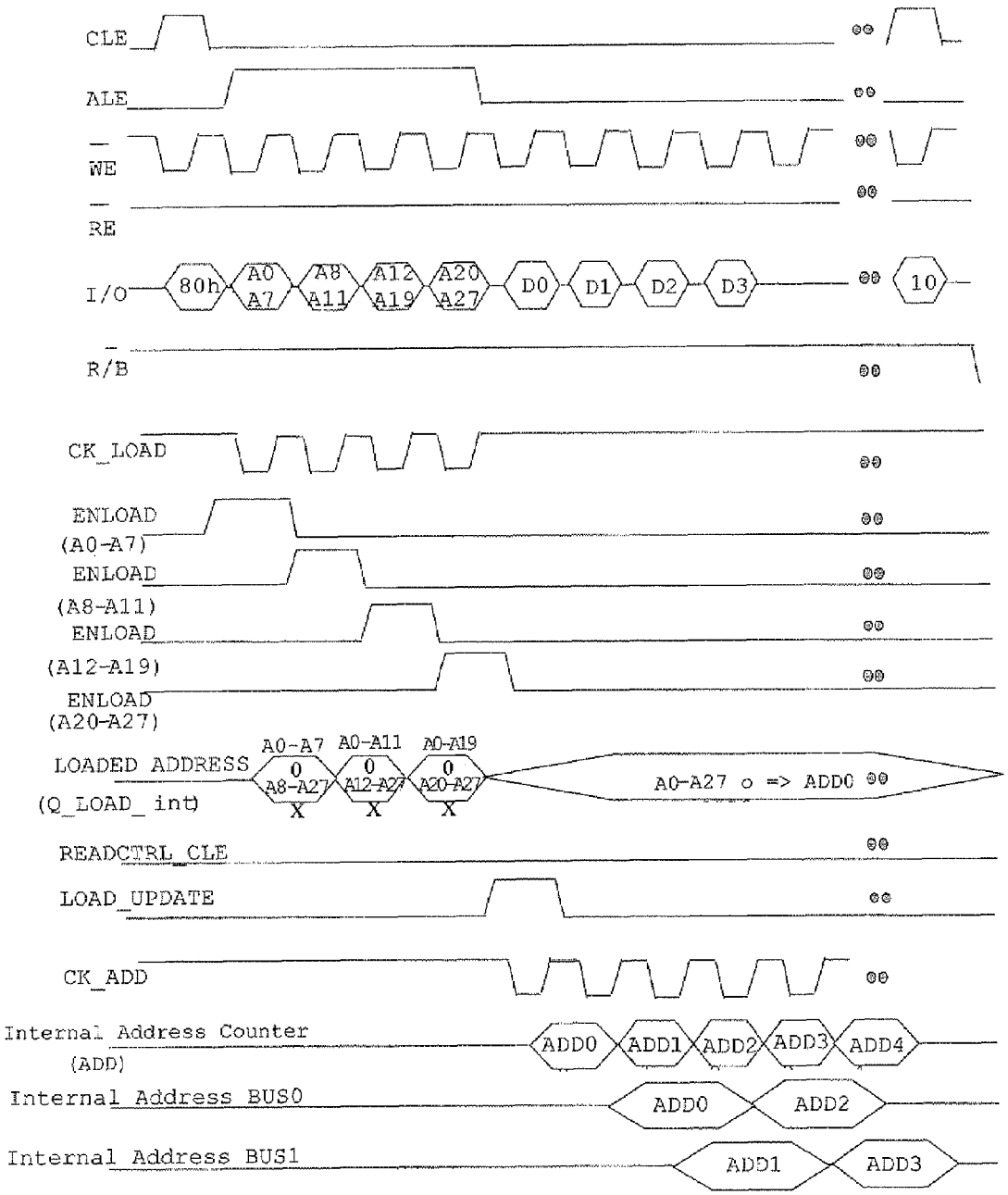
FIG. 10 illustrates the behavior of the address counter for a program operation according to the present invention.

The counter is realized by coupling together a plurality of cells of FIG. 8B such that the bit CARRY generated by a cell is fed to the cell that follows in the cascade.

The address loading flip-flop F/F1 stores the externally input address bit during ALE cycles.

The functioning of the illustrated address counter for carrying out a read operation is as follows.

The signal CK_LOAD is equal to WEN signal only during ALE cycles. The address bit value is updated in the address loading F/F1 by CK_LOAD, and corresponds to a bit of the address input by the external user.

The bit value or counted address value ADD in the main or address counting flip-flop F/F2 of a cell of the address counter is eventually updated to correspond to the bit in the address loading flip flop F/F1 at the rising of CK_ADD during the read confirm cycle (30h).

At this time, in order to support a pipeline operation as the one depicted in FIG. 5, the full counted address given by the multibit bus of all the ADD bit values of the cells of the address counter is incremented by two compared to the full address loaded in the address loading flip flops F/F1 of all the cells of the address counter. This "increment by two" of the loaded address (AX_INC_2=Q_LOAD_int[11:0]+2) takes place before LOAD_UPDATE. In other words, this is before the loaded externally input address becomes stored into the main counted flip flops F/F2 of the address counter.

Therefore, in a read operation, the signal READCTRL_CLE becomes high and the counted address value (ADD) can be updated to the incremented by two addresses at the rising edge of CK_ADD when LOAD_UPDATE=high (i.e., during the read confirm cycle (30h)).

The pipelining can be implemented with the illustrated address counter of FIG. 8A as illustrated in FIG. 8B, which depicts a cell of the cascade of cells of the counter.

FIG. 8B illustrates a cell of the cascade of cells that forms the address counter. This also includes the circuitry for implementing a pipeline identified in the circled area.

When the internal address counter is incremented at every toggling of the RE signal, the internal address buses BUS0 and BUS1 are updated to the bit values A[27:1] assumed by the cells of the internal address counter. This is according to the value a[0] of the address counting flip flop F/F of the first cell of the internal address counter.

This behavior is a key feature of the pipelining of the illustrated address counter because the page buffer, contrary to what happens in the prior art architectures of the address counter, is no longer directly connected to an address counter that implements the addition. On the contrary, in the new architecture, the page buffer will receive new address values latched in the address loading flip flops at the rising edge of the CK_ADD signal. That is, after the adding by two of the input address has been already completed (AX_INC_2=Q_LOAD_int[11:0]+2). Therefore, the risk of occurrence of glitches is significantly reduced compared to the known architectures.

Focusing on the circuitry for implementing a pipeline in the labeled circle, internal address buses BUS0 and BUS1 are updated to "load address+1" and "load address", respectively, at the same moment when the main address counter value ADD is finally updated to the "incremented-by-two" value of the externally input address previously latched in the address loading flip flops of the cells of the counter. That is, this value is Ax_INC_2=Q_LOAD_int[11:0]+2. The value of the internal signal AX_INC_1 of the pipelining circuitry is AX_INC_1=Q_LOAD_int[11:0]+1.

Thereafter, when the internal address counter is incremented by every RE signal toggling, the internal address buses BUS0 and BUS1 are updated to the address ADD stored in the internal address counter main address counting flip flops [27:1] This depends from the value of the first bit cell [0] of the internal address counter.

With the illustrated architecture, the page buffer of the memory device is no longer directly connected to a counter that accomplishes the addition on the fly. On the contrary, the page buffer will receive the new latched address bits at the rising edge of CK_ADD after the addition has already been completed. Therefore, the risk of glitches is reduced.

CK_LOAD corresponds to the WEN signal only during an ALE cycle.

The input address values LOADADD are updated in the address loading flip flops F/F1 at the rising edge of CK_LOAD.

The main F/F2 or address counting flip flops are updated to the values in the address loading flip flops F/F1 at the rising of CK_ADD during the first toggling of the input WEN of a data cycle.

There is no need to increment the address at the first rising edge of the WEN signal during a data cycle. Therefore, the first rising edge of WEN can be exploited for updating the main address counting flip flops F/F2 to the address bits input during the ALE cycles.

During a first WEN cycle, LOAD_UPDATE is high and READCTRL_CLE is low and CK_ADD corresponds to WEN. Therefore, the address counting flip flops F/F2 of the cell can be updated to the loaded address bits present in the address loading flip flops F/F1 of the cell.

From the second WEN cycle onward, the column address is incremented and the internal address buses BUS0 and BUS1 are updated to the counted address [27:1] according to the value of the first cell [0] of the internal address counter.

Figure 11:
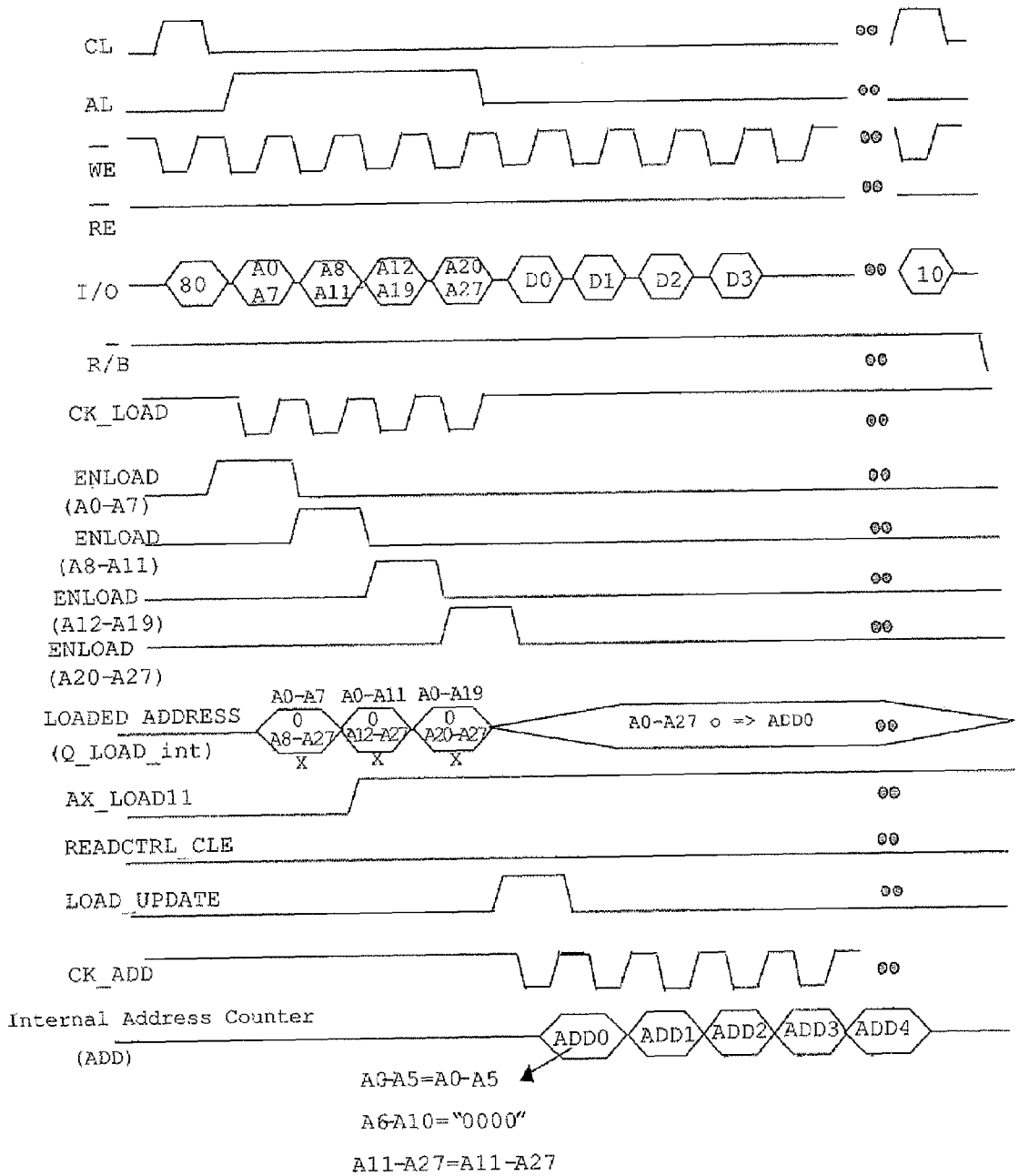
FIG. 11 illustrates the behavior of the address counter when accessing a spare area in a memory device having a large page organization (1GX8) during a program operation according to the present invention.

As shown in FIG. 11 for a program operation, the address counter values are updated to the loaded address Values during the first WEN cycle of data cycle This is similar to a confirm cycle for read operation.

Therefore, when the external user inputs an address through ALE cycles, accessing a spare area of the array, the spare area address is loaded in the address loading flip flops F/F1 by CK_LOAD.

As explained above in discussing the counting problem of known address counters, in X8 mode, the spare area access in case of a large page organization is addressed through the bit [11] (X8 mode).

Therefore, with the illustrated architecture, when the user sets the input address bit [11] to high, during the ALE cycles, AX_LOAD11 becomes high and it is possible to update the address bits A6-A10 to 00000 while the other address bits correspond to those of the input address in order to ensure a correct counter operation.

That which is claimed:

1. An address counter for a memory device comprising a memory array and a page buffer, the address counter comprising:
    an elementary cell including
        an address counting flip-flop to receive a column address bit value,
        an address loading flip-flop to load the column address bit value to address a start memory location on a selected page, and
        a logic circuit to update said address counting flip-flop to the column address bit value to address the start memory location on the selected page during a read confirm cycle in a read sequence, and during a first data input cycle in a program sequence.

2. The address counter of claim 1 further comprising a carry signal propagation logic circuit associated with the elementary cell.

3. The address counter of claim 1 wherein the elementary cell further comprises a transfer circuit to implement a parallel data transfer scheme, said transfer circuit comprising:
    first and second internal address bus driving flipflops;
    first and second internal address buses to be driven by said respective first and second internal address bus driving flip-flops, with said second internal address bus to be without a first bit and to be updated based on a read enable clock signal during a read sequence and a write enable clock signal during a program sequence; and an updating circuit to update an address bit content of said first and second internal address bus driving flipflops at a change of a counted address in said address counting flip-flop at a rising edge of a logic AND signal of a clock signal with a negate of the first bit value of a new counted address for said first internal address bus, and with the direct first bit value of the new counted address for said second internal address bus.

4. The address counter of claim 3 wherein during the read sequence said updating circuit is to update an input address value when the counted address in said counting flip-flop is incremented-by-two at a rising edge of the clock signal, and thereafter, upon incrementing the address counter based on a read enable command; and wherein said first and second internal address bus driving flip-flops are to be updated according to the first bit value of every new counted address.

5. The address counter of claim 1 wherein the page buffer is to store data read from the selected memory array page for data to be read therefrom starting from an addressed memory array location during the read sequence, and during data input cycles to the device to be written starting from the addressed memory array location during the program sequence.

6. The address counter of claim 1 further comprising an input logic circuit to generate a clock signal and for managing commands from an external user; and wherein said address counting flip-flop is to address the start memory location on the selected page at a rising edge of the clock signal.

7. The address counter of claim 1 wherein the column address bit value loaded by said address loading flip-flop is to be input by an external user of the memory device, with the start memory location to be addressed on the selected page at a rising edge of a clock signal; and wherein the column address bit value to be loaded by said address loading flip-flop is to be input by the external user, with the start memory location to be addressed on the selected page at the rising edge of the clock signal.

8. The address counter of claim 1 wherein said logic curcuit is to update said address counting flip-flop at a rising edge of a clock signal, with the column address bit value to be input by an external user of the memory device to address the start memory location on the selected page when an internally generated control signal is active during the read confirm cycle in the read sequence, and during the first data input cycle in the program sequence.

9. The address counter of claim 1 further comprising a cascade of elementary cells including the elementary cell.

10. A memory device comprising
a memory array;
a page buffer coupled to said memory array; and
an address counter having an elementary cells that includes,
   an address counting flip-flop to receive a column address bit value,
   an address loading flip-flop to load the column address bit value to address the start memory location on the selected page, and
   a logic circuit to update said address counting flip-flop to the column address bit value to address the start memory location on the selected page in said page buffer during a read confirm cycle in a read sequence, and during a first data input cycle in a program sequence.

11. The memory device of claim 10 wherein the elementary cell further includes a transfer circuit to implement a parallel data transfer scheme, said transfer circuit comprising:
first and second internal address bus driving flip-flops;
first and second internal address buses to be driven by said respective first and second internal address bus driving flip-flops, with said second internal address bus to be without a first bit and to be updated based on a read enable clock signal during a read sequence and a write enable clock signal during a program sequence; and
an updating circuit to update an address bit content of said first and second internal address bus driving flipflops at a change of a counted address in said address counting flip-flop at a rising edge of a logic AND signal of a clock signal with a negate of the first bit value of a new counted address for said first internal address bus, and with the direct first bit value of the new counted address for said second internal address bus.

12. The memory device of claim 11 wherein during the read sequence said updating circuit is to update an input address value when the counted address in said counting flip-flop is incremented-by-two at a rising edge of the clock signal, and thereafter, upon incrementing the address counter based on a read enable command; and wherein said first and second internal address bus driving flip-flops are to be updated according to the first bit value of every new counted address.

13. The memory device of claim 10 wherein the page buffer is to store data read from the selected memory array page for data to be read therefrom starting from an addressed memory array location during the read sequence, and during data input cycles to the device to be written starting from the addressed memory array location during the program sequence.

14. The memory device of claim 10 wherein the elementary cell further includes an input logic circuit to generate a clock signal and to manage commands from an external user; and wherein said address counting flip-flop addresses the start memory location on the selected page at a rising edge of the clock signal.

15. The memory device of claim 10 wherein the column address bit value loaded by said address loading flip-flop is to be input by an external user of the memory device, with the start memory location to be addressed on the selected page at a rising edge of a clock signal; and wherein the column address bit value to be loaded by said address loading flip-flop is to be input by the external user of the memory device, with the start memory location to be addressed on the selected page at the rising edge of the clock signal.

16. The memory device of claim 10 wherein said logic circuit is to update said address counting flip-flop at a rising edge of a clock signal, with the column address bit value to be input by an external user of the memory device to address the start memory location on the selected page when an internally generated control signal is to be active during the read confirm cycle in the read sequence, and during the first data input cycle in the program sequence.

17. A method comprising
receiving, at an address counting flip-flop of an elementary cell of an address counter, a column address bit value;
loading the column address bit value in an address loading flip-flop, of the elementary cell, for addressing a start memory location on a selected page in a page buffer; and
updating the address counting flip-flop to the column address bit value for addressing a start memory location on the selected page during a read confirm cycle in a read sequence and during a first data input cycle in a program sequence.

18. The method of claim 17 further comprising:
driving first and second internal address buses by respective first and second internal address bus driving flipflops, with the second internal address bus being without a first bit and being updated based on a read enable clock signal in a read sequence and on a write enable clock signal during a program sequence; and updating an address bit content of the first and second internal address bus driving flip-flops with an updating circuit at a change of a counted address in the address counting flip-flop at a rising edge of a logic AND signal of a clock signal with a negate of the first bit value of the new counted address for the first internal address bus, and with the direct first bit value of the new counted address for the second internal address bus.

19. The method of claim 18 wherein during the read sequence the updating circuit respectively updates an input address value at an instant the counted address in the counting flip-flop is incremented-by-two at a rising edge of the clock signal, and thereafter, upon incrementing the address counter based on a read enable command; and wherein the first and second internal address bus driving flip-flops are updated according to the first bit value of every new counted address.

20. The method of claim 17 further comprising storing, in a page buffer, data read from the selected memory array page for data to be read therefrom starting from an addressed memory array location during the read sequence, and during data input cycles to the device to be written starting from the addressed memory array location during the program sequence.

21. The method of claim 17 further comprising
generating, with an input logic circuit of the elementary cell, a clock signal for managing commands from an external user of the memory device; and
addressing, with the address counting flip-flop, the start memory location on the selected page at a rising edge of the clock signal.

22. The method of claim 17 wherein the column address bit value loaded by the address loading flip-flop is input by an external user, with the start memory location being addressed on the selected page at a rising edge of a clock signal; and wherein the column address bit value loaded by the address loading flip-flop is input by the external user, with the start memory location being addressed on the selected page at the rising edge of the clock signal.

23. The method of claim 17 further comprising updating, with the logic circuit, the address counting flip-flop at a rising edge of a clock signal, with the column address bit value being input by an external user for addressing the start memory location on the selected page when an internally generated control signal is active during the read confirm cycle in the read sequence, and during the first data input cycle in the program sequence.

24. The memory device of claim 10 wherein the address counter further includes a cascade of elementary cells including the elementary cell.

* * * * *

UNITED STATES PATENT AND TRADEMARK OFFICE
CERTIFICATE OF CORRECTION

PATENT NO. : 7,558,152 B2  Page 1 of 1
APPLICATION NO. : 11/829527
DATED : July 7, 2009
INVENTOR(S) : Hyungsang Lee et al.

It is certified that error appears in the above-identified patent and that said Letters Patent is hereby corrected as shown below:

In the Claims:

Column 9, line 37, "... logic curcuit ..." should read --... logic circuit ...--;

Column 9, line 51, "... an elementary cells ..." should read --... an elementary cell ...--; and Column 9, line 52, "... includes," should read --... includes--.

Signed and Sealed this

Thirteenth Day of October, 2009

David J. Kappos
*Director of the United States Patent and Trademark Office*